(12) United States Patent
Tsuruoka

(10) Patent No.: US 6,591,092 B1
(45) Date of Patent: Jul. 8, 2003

(54) SIGNAL RECEIVING APPARATUS WITH A GAIN CONTROLLER AND METHOD THEREOF

(75) Inventor: Tatsuya Tsuruoka, Tokyo (JP)

(73) Assignee: Sony Corporation, Tokyo (JP)

( * ) Notice: Subject to any disclaimer, the term of this patent is extended or adjusted under 35 U.S.C. 154(b) by 467 days.

(21) Appl. No.: 09/629,709

(22) Filed: Jul. 31, 2000

(30) Foreign Application Priority Data

Jul. 30, 1999 (JP) .......................................... 11-216845

(51) Int. Cl.⁷ ................................................. H04B 1/06
(52) U.S. Cl. ................................ 455/232.1; 453/234.1; 453/240.1; 375/316
(58) Field of Search ........................... 455/232.1, 233.1, 455/234.1, 234.2, 239.1, 240.1, 241.1, 242.2, 244.1, 245.1, 3.06; 375/345, 316; 381/107, 109, 104

(56) References Cited

U.S. PATENT DOCUMENTS

| 4,827,511 A | * | 5/1989 | Masuko ....................... 380/221 |
| 5,086,437 A | * | 2/1992 | Tomita ......................... 375/345 |
| 5,142,695 A | * | 8/1992 | Roberts et al. ............. 455/550 |
| 5,222,104 A | * | 6/1993 | Medendorp .................. 375/308 |
| 5,223,843 A | * | 6/1993 | Hutchinson .................. 342/352 |
| 5,513,387 A | * | 4/1996 | Saito et al. ............... 455/243.1 |
| 5,526,160 A | * | 6/1996 | Watanabe et al. ........... 359/163 |

* cited by examiner

Primary Examiner—William Trost
Assistant Examiner—Congvan Tran
(74) Attorney, Agent, or Firm—Jay H. Maioli

(57) ABSTRACT

A gain of a broadcast signal receiver for the digital audio broadcast (DAB) system is controlled in order to obtain an output signal of a predetermined level using an AGC loop. The DAB signal of the DAB system includes a Guard Interval within an interval of each symbol, and the Guard Interval does not include valid data to be recovered. Accordingly, the gain change of the AGC loop is done within the Guard Interval in order to avoid signal distortion in the output signal, thereby the DAB receiver having high fidelity is achieved with low cost.

11 Claims, 9 Drawing Sheets

SIGNAL RECEIVING APPARATUS WITH A GAIN CONTROLLER AND METHOD THEREOF

BACKGROUND OF THE INVENTION

1. Field of the Invention

This invention relates to signal receiver and more particularly a signal receiver with a gain controller that controls a gain of its amplifier for received signal, the signal having a time interval containing a valid data and a time interval containing an invalid data.

2. Description of the Related Art

In Europe, a broadcast system called a DAB (Digital Audio Broadcast) system is now in operation. In this DAB system, an OFDM (Orthogonal Frequency Division Multiplex) modulation system that is one of multi-carrier digital modulation technique is employed for generating a broadcast signal.

In this OFDM modulation system, a modulated signal comprises a plurality of carriers having orthogonal relations each other. For example, in case of the DAB system, an audio signal is encoded at first, and thus encoded audio signal is allocated to each of a plurality of carriers for modulation. This digital signal comprised of a plurality of modulated carriers in a frequency domain is converted into a digital signal in a time domain by applying the Reverse Fourier Transform and this digital signal of the time domain is converted into an analog signal. Thus converted analog signal is transmitted as the broadcast signal.

In a signal receiver of the DAB system, a received modulated signal is converted into a digital signal and then the Discrete Fourier Transform is applied to this converted digital signal. Resultantly, an audio data allocated to each carrier is provided by this Discrete Fourier Transform.

A signal transmission by the OFDM modulation system is done by a sequence of an unit called a symbol as shown in FIG. 9A. In the signal receiver of the DAB system, when a received data signal in this FIG. 9A is demodulated, the received data signal is amplified with an AGC (Automatic Gain Control) processing at an intermediate frequency signal stage.

In the case of a DAB receiver which receives the broadcast signal of the DAB system, the AGC operation is controlled by a digital signal processing. A gain of an amplifier at the intermediate frequency signal stage is changed in step by the digitally controlled AGC as shown in FIG. 9B relative to the received data signal. In the case when the gain of the amplifier at the intermediate frequency signal stage is changed in incremental steps by the digitally controlled AGC as shown in FIG. 9B, an output intermediate frequency signal obtained from the intermediate frequency signal stage includes distortions at points (depicted in FIG. 9A by arrows with dot-lines). These distortions occur due to abrupt level change in the output intermediate frequency signal. Namely in this case, a fidelity of data obtained from the demodulated signal becomes low and error rate of the recovered data becomes high.

In order to avoid above defects, an AGC system of high quality is required. Such AGC system of high quality requires more high grade digital signal processing for the AGC system, and accordingly the cost for the signal receiver becomes high.

SUMMARY OF THE INVENTION

In order to overcome above described defects, a timing of gain change for the AGC processing at an amplifier is selected within a time interval where valid data does not exist in a received data stream according to the present invention.

Namely, a digital signal to be received by a digital information signal receiver includes a valid interval and invalid interval in the received data stream. In order to avoid signal distortions in the recovered signal, gain change in the AGC processing of the digital information signal receiver is done within the invalid interval where the valid data does not exist.

According to the present invention, the gain control for the information receiving apparatus that receives information signal having valid time interval and invalid time interval comprises: amplification means for amplifying the received information signal; means connected to the amplification means for processing output signal of the amplification means; means coupled to the amplification means for controlling gain of the amplification means; and means coupled to the gain control means for controlling a timing of gain setting of the gain control means at interval where said processing means does not process the output signal in said valid time interval in the received information data.

In the gain control of this invention, the timing control means executes the gain setting of the gain control means within the invalid time interval.

Further in the gain control of this invention, the gain control means holds gain of the amplification means during the valid time interval of the received information data.

In the another aspect of the present invention, the gain control of this invention further comprises: means coupled to the amplification means for comparing signal level of the output signal and a reference level to generate an error signal; and means coupled to the comparing means for deriving low frequency components of the error signal, wherein the low frequency components of the error signal being supplied to the gain control means.

In a more specific application of this invention, the gain control for the broadcast signal receiving apparatus that receives broadcast signal having valid time interval and invalid time interval comprises: amplification means for amplifying the received broadcast signal; means connected to the amplification means for processing output signal of the amplification means; means coupled to the amplification means for controlling gain of the amplification means; and means coupled to the gain control means for controlling a timing of gain setting of the gain control means at interval where said processing means does not process the output signal in said valid time interval in the received broadcast signal.

Further in the gain control for the broadcast signal receiving apparatus, the timing control means executes the gain setting of the gain control means within the invalid time interval included in the received broadcast data.

Further in the gain control for the broadcast signal receiving apparatus that receives broadcast data, the gain control means holds gain of the amplification means during the valid time interval of the received broadcast data.

The gain control for a broadcast signal receiving apparatus of this invention further comprises: means coupled to the amplification means for comparing signal level of the output signal and a reference level to generate an error signal; and means coupled to the comparing means for deriving low frequency components of the error signal, wherein the low frequency components of the error signal being supplied to the gain control means.

More specific aspect of the present invention, in the gain control for a broadcast signal receiving apparatus, the broadcast signal is a data comprised of plurality of carriers having orthogonal relations each other, and the processing means includes the Fast Fourier Tansform processing.

This invention further propose a method for controlling a gain of an information receiving apparatus that receives information data having valid time interval and invalid time interval.

The method of this invention comprises the steps of: amplifying a received information signal; processing output signal of the amplification step; controlling gain of the amplification step; and controlling a timing of gain setting of the gain control at interval where the processing step does not process the output signal in the valid time interval in the received information signal.

In the method of this invention, the timing control step executes the gain setting in the gain control step within the invalid time interval.

Further in the method of this invention, the gain control step holds gain of the amplification step during the valid time interval of the received information signal.

In accordance with the present invention, distortions due to gain change in the AGC system of the signal receiver are avoided without using high grade digital signal processing. Namely, the timings of the gain change are done within intervals where valid data does not exist in order to avoid the distortions due to the gain change.

Here in below, preferred embodiments of this invention are explained in detail with reference to drawings. Namely, the examples described here in after are the best mode of embodiments of this invention, therefore there are technically suitable various limitations, but the scope of this invention is not affected by these limitations unless there is a description about restriction of this invention in the explanation below.

DETAILED DESCRIPTION OF THE PREFERRED EMBODIMENTS

One example of an AGC (Automatic Gain Control) processing for a signal receiver of this invention is explained with reference to drawings. The signal receiver of this embodiment is preferably a DAB (Digital Audio Broadcast) receiver which receives the DAB signal now in use in Europe.

The explanation is done here with reference to the following order.
1) The DAB signal format.
2) The DAB signal receiver.
3) An AGC processing.

At first, a signal format employed in the DAB system is explained with reference to FIGS. 4 to 8.

1) The DAB Signal Format.

The DAB signal handled in the DAB system employs an OFDM (Orthogonal Frequency Division Multiplex) modulation system. In this OFDM modulation system, plural carriers are modulated by digital information, in which frequency components of these carriers are in orthogonal relations each other. For example, in case of the DAB system, an audio signal is encoded at first, and thus encoded audio signal are allocated to each of a plurality of carriers for modulation. Thus modulated carriers are treated as digital signal of frequency domain.

This digital signal comprised of a plurality of modulated carriers in frequency domain is converted into digital signal in time domain by applying the Reverse Fourier Transform and this digital signal of time domain is converted into analog signals. Thus converted analog signals are transmitted as the broadcast signal.

Further in this OFDM modulation system for the DAB system, data of two bits is assigned to one carrier and each carrier is modulated using a QPSK (Quadrature Phase Shift Keying) system. This modulation is called as an OFDM-QPSK modulation.

In this OFDM modulation system, the number of points in the Fast Fourier Transform corresponds to the number of carriers, and this number of points (the number of carriers) are different based on the mode in the DAB system standard. In the current DAB system standard, there are 4 modes and detailed signal format for each mode is explained here-in-below.

Figure 4:
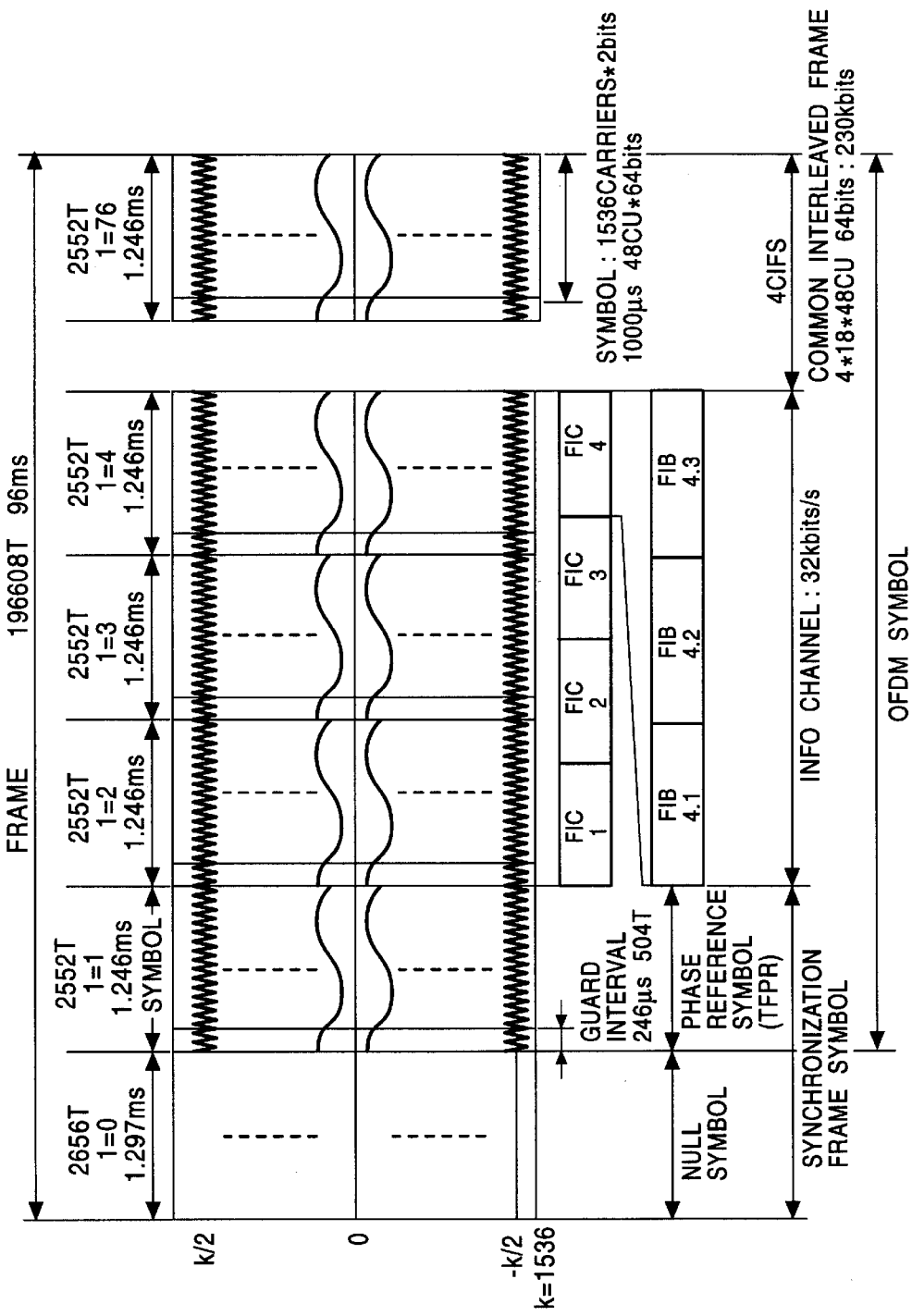
FIG. 4 is an illustration showing the mode 1 format of the DAB signal.

FIG. 4 shows a signal format of the mode 1, where the number k of the carriers is expressed as k=1536. Accordingly, as explained by a formula expressed as 2 bits×1536=3072 bits, it is possible to transmit data of 3072 bits. This transmitting unit is called as a symbol.

In this mode 1, 1 Frame has 77 symbols. As a structure of one frame, one null symbol (symbol number 1=0) is located at its leading top, and 76 symbols (symbol number 1=1~76) are followed with the null symbol. These 76 symbols are treated as an OFDM symbol.

The null symbol has 2656T of time interval, namely 1.297 msec of time interval, where T=1/2.048 MHz=0.00048828 msec. In the case of 76 symbols of symbol number 1, each symbol has 2552T of time interval, namely 1.246 msec. Accordingly, one frame has 196608T of time interval, namely 96 msec.

Following the null symbol, a TFPR (Time Frequency Phase Reference) symbol of symbol number 1=1 is arranged. A first one of the TFPR symbols and the null symbol become SF (Synchronization Frame) symbols for frame synchronization.

In the DAB signal receiver, the null symbol among received signal is detected at first. Following the detection of the null symbol, the TFPR symbol is detected and is analyzed to evaluate a frequency offset and a time offset of the OFDM symbols. Namely like as an usual receiver, the DAB receiver synchronizes in the frequency domain and the time domain of the received symbols and after that the synchronization to the received data is done.

Three symbols of 2nd, 3rd and 4th in the symbol number 1 of the OFDM symbols are called a FIC (Fast Information Channel). In the mode 1, 4 FICs are assigned to the consecutive 3 symbols and each FIC has 3 FIBs (Fast information Block). Namely in the mode 1, one frame has information of 4 FICs which include totally 12 FIBs. These 12 FIBs have information of the data contents in this frame.

The rest of 72 symbols of 5th to 72nd of symbol number 1 are divided into 4 CIFs (Common Interleaved Frame). Namely, each CIF has 18 OFDM symbols. Data size of these 4 CIFs is expressed as 4×18×48 CU (Capacity Unit)×64 bits, namely 2304 kbits/sec.

Figure 8:
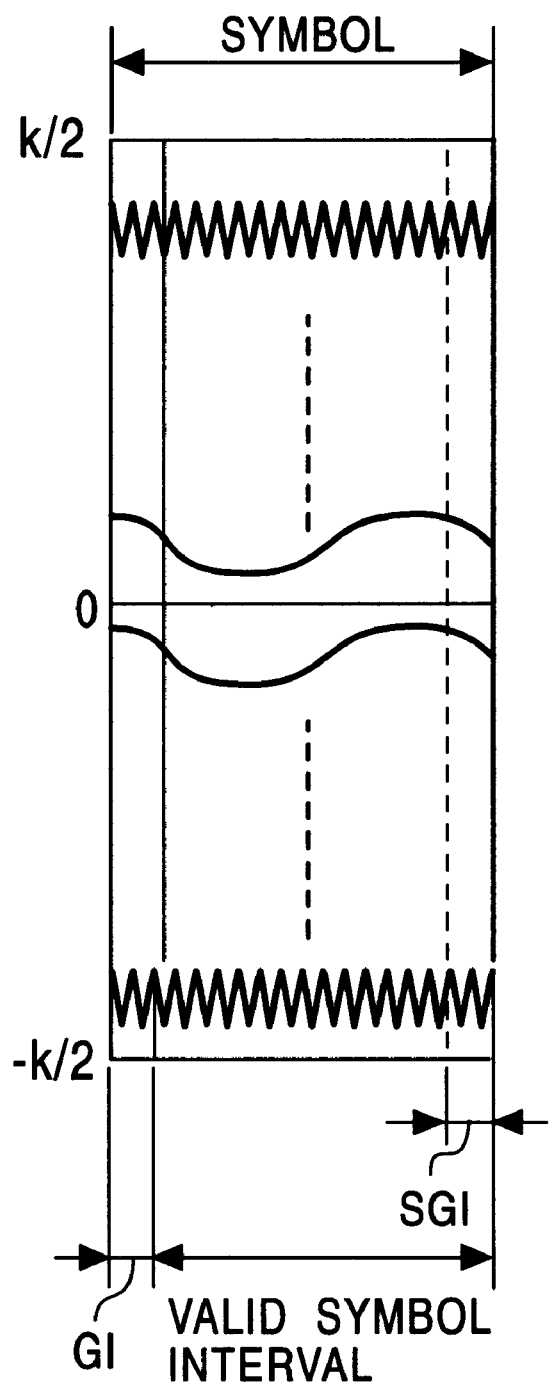
FIG. 8 is an illustration showing the format of the OFDM symbol.
Figure 9:
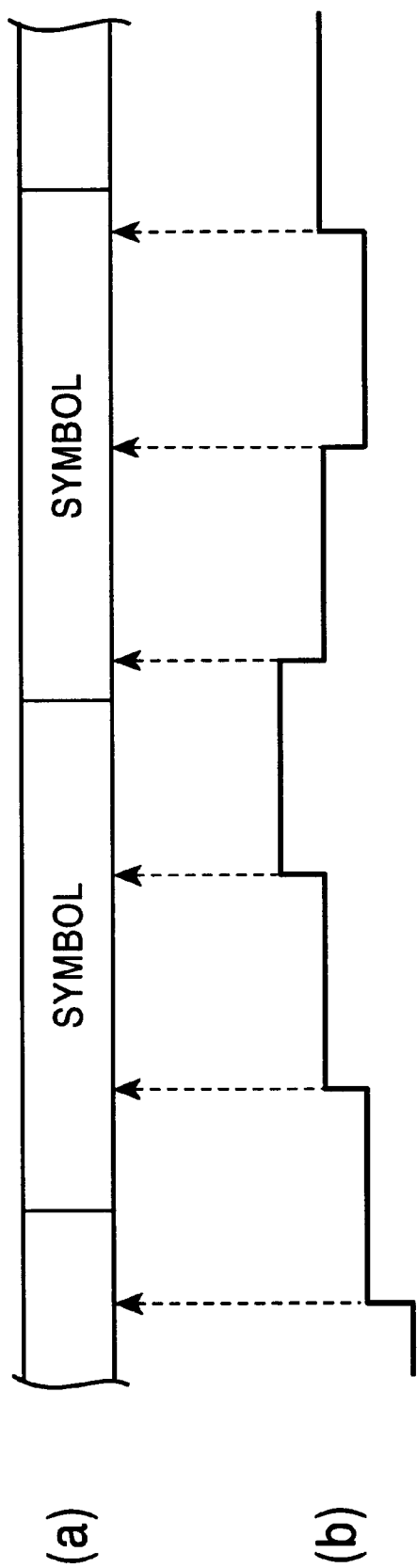
FIGS. 9A and 9B are timing charts showing the AGC processing of the conventional receiver.

Each of the OFDM symbols of 1st to 76th of symbol number 1 except the null symbol has a construction as shown in FIG. 8. Namely, one OFDM symbol is shown in FIG. 8 in enlarged form. The OFDM symbol has a GI (Guard Interval) at first and a valid symbol interval is followed with the GI. A time interval of the GI depends on a mode of operation, and in the case of the mode 1, the time interval of the GI is 504T, namely 246 μsec and a time interval of the valid symbol interval is 2048T (48 CU×64 bits), namely 1000 μsec.

In this valid symbol interval, valid data to be applied a signal processing is arranged, but in a trailing part of the valid symbol interval, data of the same type as arranged in the GI is also arranged, and this interval is called as a SGI (Sub Guard Interval). Namely, the GI and the SGI is an interval of the OFDM symbol, where valid data does not exist. On the contrary, the valid symbol interval is an interval of the OFDM symbol, where valid data does exist except above mentioned SGI.

Within one OFDM symbol, plural carriers having different frequency are included as described before. Among these carriers, a carrier at 0 is a carrier having a center frequency (a cycle of the carrier is T), a carrier at k/2 is a carrier having the highest frequency and a carrier at −k/2 is a carrier having the lowest frequency in FIG. 8. The volume of data within one symbol is expressed as k×2 bits.

In the mode 1 of the DAB signal format, the k is 1536 as described before, so that the carrier of the highest frequency is expressed as k/2=1536/2=766 and the carrier of the lowest frequency is expressed as −k/2=−1536/2=−766.

Further the volume of data within one symbol is expressed as k×2=1536×2 bits=3072 bits.

Figure 5:
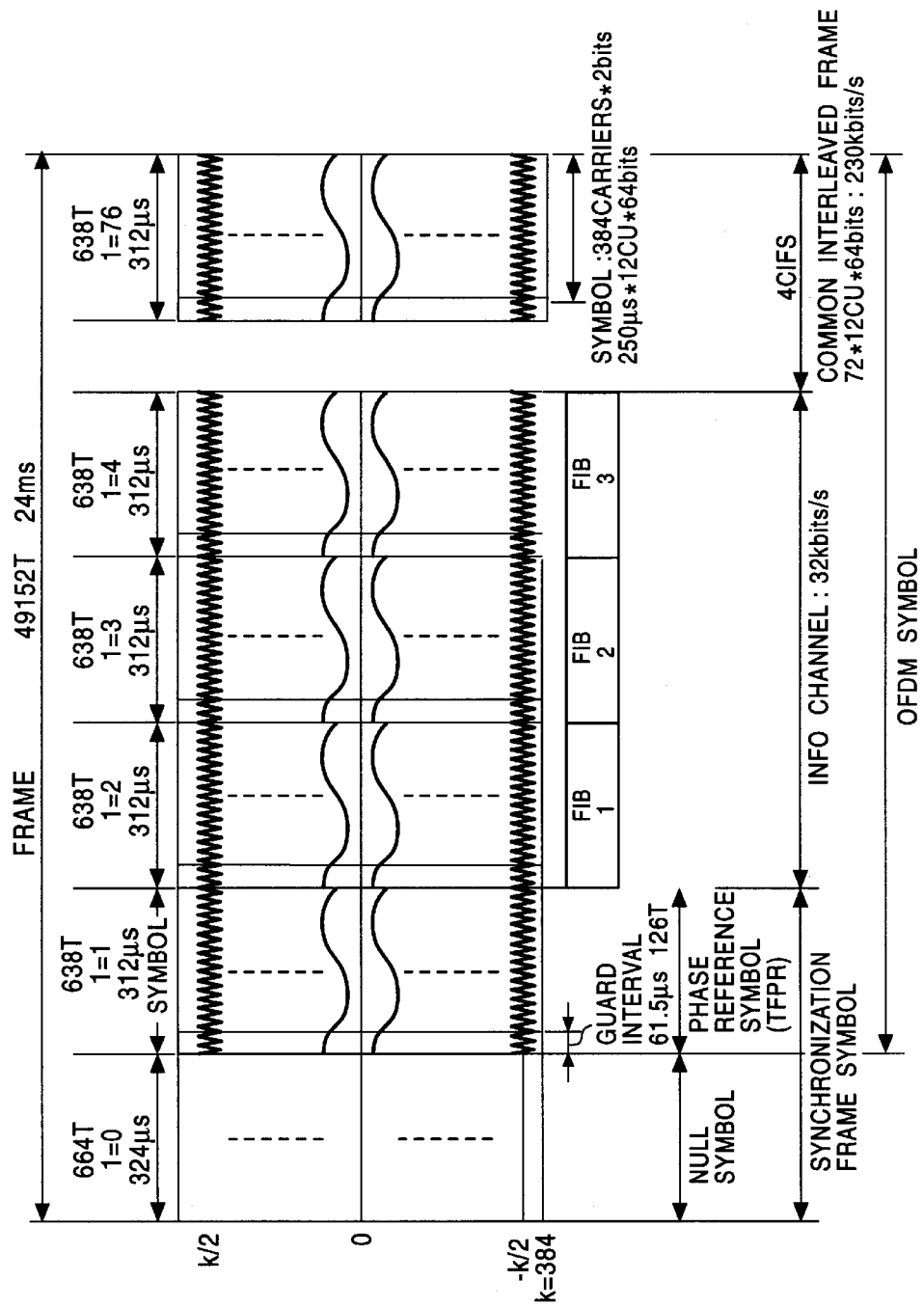
FIG. 5 is an illustration showing the mode 2 format of the DAB signal.

FIG. 5 shows the mode 2 of the DAB signal format. In this mode 2, the number k of carriers is 384 and is ¼ of the number of carriers in the mode 1. Following the null symbol (symbol number=0), the OFDM symbols of symbol number 1=1~76 are arranged. Namely as like the mode 1, each frame includes 77 symbols including the null symbol.

Further the null symbol has 664T of time interval, namely 324 μsec of time interval, and each of the OFDM symbols has 638T of time interval, namely 312 μsec. The number k of carriers at each OFDM symbol is 384. Accordingly the volume of data in each symbol is expressed as k×2 bits=384×2 bits, and the each GI within one symbol has 126T of time interval, namely 61.5 μsec. Further a valid symbol interval is expressed as 12CU×64 bits, namely 250 μsec.

As a structure of the OFDM symbol area, a symbol of symbol number 1=1 is a TFPR symbol, and forms FS symbols together with the null symbol. This explanation about the FS symbols are also applied to the mode 3 and mode 4.

In this mode 2, consecutive 3 symbols of the symbol number 1=2~4 includes 3 FIBs as shown FIG. 5. Further 4 CIFs are formed with symbols of symbol number 1=5~76. The volume of data in these CIFs are expressed as 4=18× 12CU×64 bits. The time interval of one frame is expressed as 49152T=24 msec.

Figure 6:
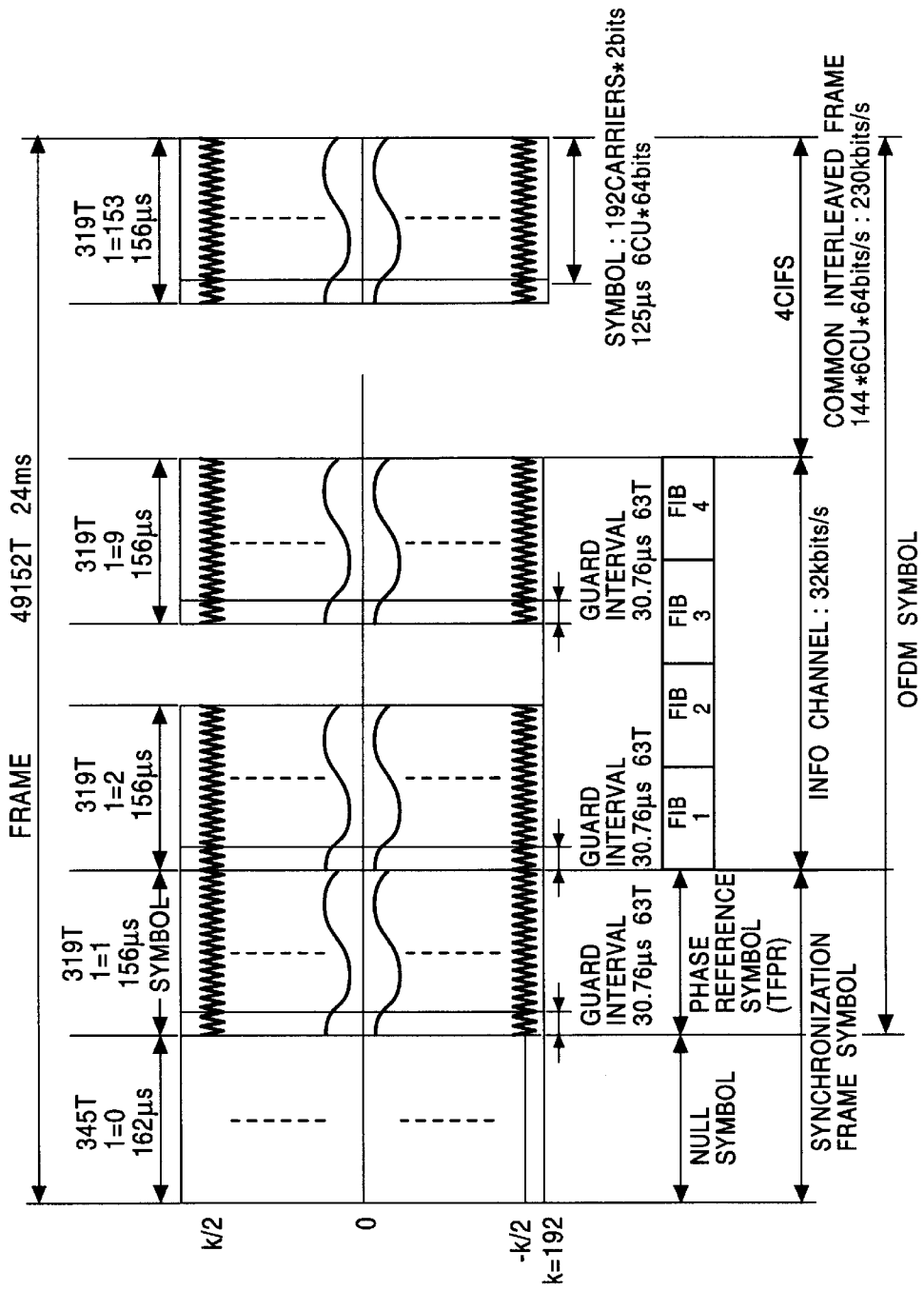
FIG. 6 is an illustration showing the mode 3 format of the DAB signal.

FIG. 6 shows the mode 3 of the DAB signal format. In this mode 3, the number k of carriers is 192 and is ⅛ of the number of carriers in the mode 1. Following the null symbol (symbol number=0), the OFDM symbols of symbol number 1=1~153 are arranged. Namely in this mode 3, each frame includes 154 symbols including the null symbol.

Further the null symbol has 345T of time interval, namely 162 μsec of time interval, and each of the OFDM symbols has 319T of time interval, namely 156 μsec.

The number k of carriers at each OFDM symbol is 192. Accordingly the volume of data in each symbol is expressed as k×2 bits=192×2 bits, and the each GI within the symbol has 63T of time interval, namely 30.75 μsec. Further a valid symbol interval is expressed as 6CU×64 bits, namely 125 μsec.

In this mode 3, consecutive 8 symbols of the symbol number 1=2~9 includes 4 FIBs as shown FIG. 6. Further one CIF is formed with symbols of symbol number 1=10~153. The volume of data in this CIF is expressed as 144×6CU×64 bits. The time interval of one frame is expressed as 49152T= 24 msec.

Figure 7:
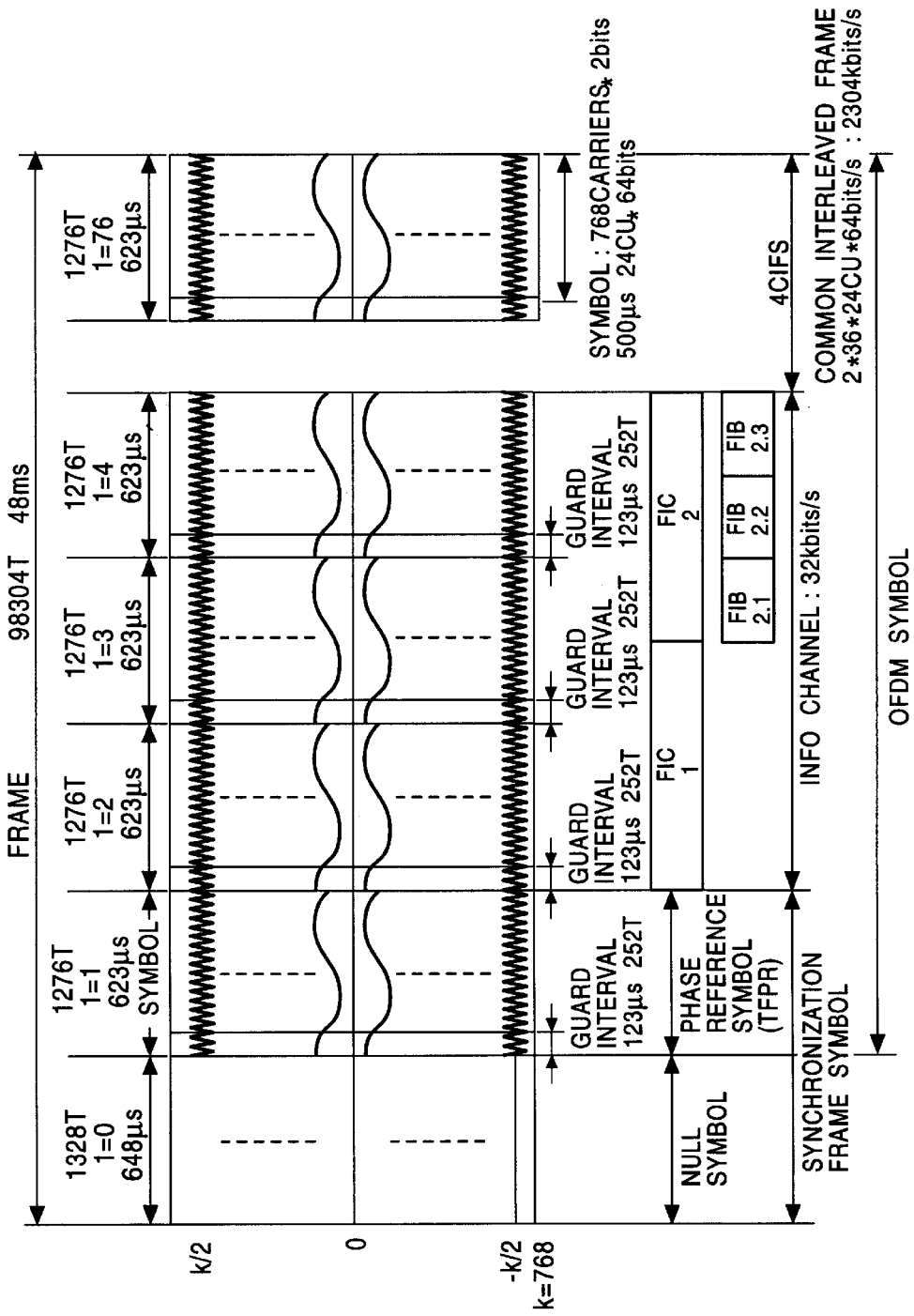
FIG. 7 is an illustration showing the mode 4 format of the DAB signal.

FIG. 7 shows the mode 4 of the DAB signal format. In this mode 4, the number k of carriers is 768 and is ½ of the number of carriers in the mode 1. Following the null symbol (symbol number=0), the OFDM symbols of symbol number 1=1~76 are arranged. Namely in this mode 4, each frame includes 77 symbols including the null symbol.

Further the null symbol has 1328T of time interval, namely 648 μsec of time interval, and each of the OFDM symbols has 1276T of time interval, namely 623 μsec.

The number k of carriers at each OFDM symbol is 768. Accordingly the volume of data in each symbol is expressed as k×2 bits=768×2 bits, and the each GI within the symbol has 252T of time interval, namely 123 μsec. Further a valid symbol interval is expressed as 24CU×64 bits, namely 500 μsec.

In this mode 4, consecutive 3 symbols of the symbol number 1=2~4 includes 2 FICs as shown FIG. 7 and each FIC has 3 FIBs. Further 2 CIFs are formed with 72 symbols of symbol number 1=5~76. The volume of data in this CIF is expressed as 2×36×24CU×64 bits. The time interval of one frame is expressed as 98304T=48 msec.

2) The DAB Signal Receiver.

One example of the DAB receiver is explained with reference to FIG. 1, where a broadcast wave of the above described format of the DAB system is received by an antenna 1. Thus received broadcast wave is supplied to an RF (Radio Frequency) processor 2, and here the received broadcast wave is amplified and frequency-converted into an IF (Intermediate Frequency) signal. The RF processor 2 includes an IF signal amplifier 3, and the IF signal is obtained through this IF signal amplifier 3. Accordingly, a base-band DAB signal of the OFDM modulation system is provided at an output of the RF processor 2 as the IF signal.

The DAB signal (IF signal) derived from the RF processor 2 is supplied to a quadrature demodulator 5 after being converted into a time sequential digital signal at an analog to digital converter 4. In addition, the time sequential digital signal from the analog to digital converter 4 is also supplied to a level controller 12.

In this quadrature demodulator 5, the DAB signal of the time sequential digital signal is processed based on demodulation of the OFDM modulation system and the demodulated signal is supplied to a FFT (Fast Fourier Transformer) circuit 6. This FFT circuit 6 executes the Fast Fourier Transform processing to the demodulated signal from the quadrature demodulator 5, and this demodulated signal is converted into data of respective carrier in frequency domain by this processing. The data from the FFT circuit 6 is then supplied to a Viterbi decoder 7, where Viterbi decode processing is executed to the data from the FFT circuit 6.

An output of the Viterbi decoder 7 is then supplied to an audio decoder 8. The audio data transmitted as the DAB signal is compressed based on the MPEG (Moving Picture Expert Group) format, for example, so that input data (which is compressed) is decompressed at this audio decoder 8, and converted into digital audio data. Thus obtained digital audio data is supplied to a D/A (Digital to Analog) converter 9, where the digital audio data is converted into analog audio signal. The analog audio signal obtained at a terminal 10 is supplied to an audio amplifier and a speaker of a later stage (not shown).

Next, a sync processor 11 receives the DAB signal from the RF processor 2 and executes sync processing by detecting the FS (Frame Synchronization) symbols such as described above. Namely, the sync processor 11 controls timings for signal processing at the RF processor 2, the quadrature demodulator 5 and the FFT circuit 6 in synchronization with the input timing of the received DAB signal.

Further this sync processor 11 generates a TBC (Time Base Correction) signal and this TBC signal is supplied to the quadrature demodulator 5, the FFT circuit 6, the Viterbi decoder 7 and the audio decoder 8 for controlling signal processing operation of these circuit blocks based on timings of the TBC signal. The sync processor 11 generates an AFC (Automatic Frequency Control) signal to be supplied to the RF processor 2. The RF processor 2 controls a receiving frequency based on this AFC signal.

A level controller 12 generates a gain control signal G·CNT for controlling gain of the IF signal amplifier 3 based on level of the digital signal of the DAB signal supplied from the A/D converter 4. Accordingly the signal level of the DAB signal obtained from the RF processor 2 becomes constant. This control loop performs an AGC operation to the IF amplifier 3. A detailed construction of this level controller 12 is explained later.

A timing generator 13 generates a timing control signal T·CNT for controlling switching operation of the gain change at the IF signal amplifier 3, and the level controller 12 receives this timing control signal T·CNT from the timing generator 13 and executes the gain change of the IF signal amplifier 3.

Figure 1:
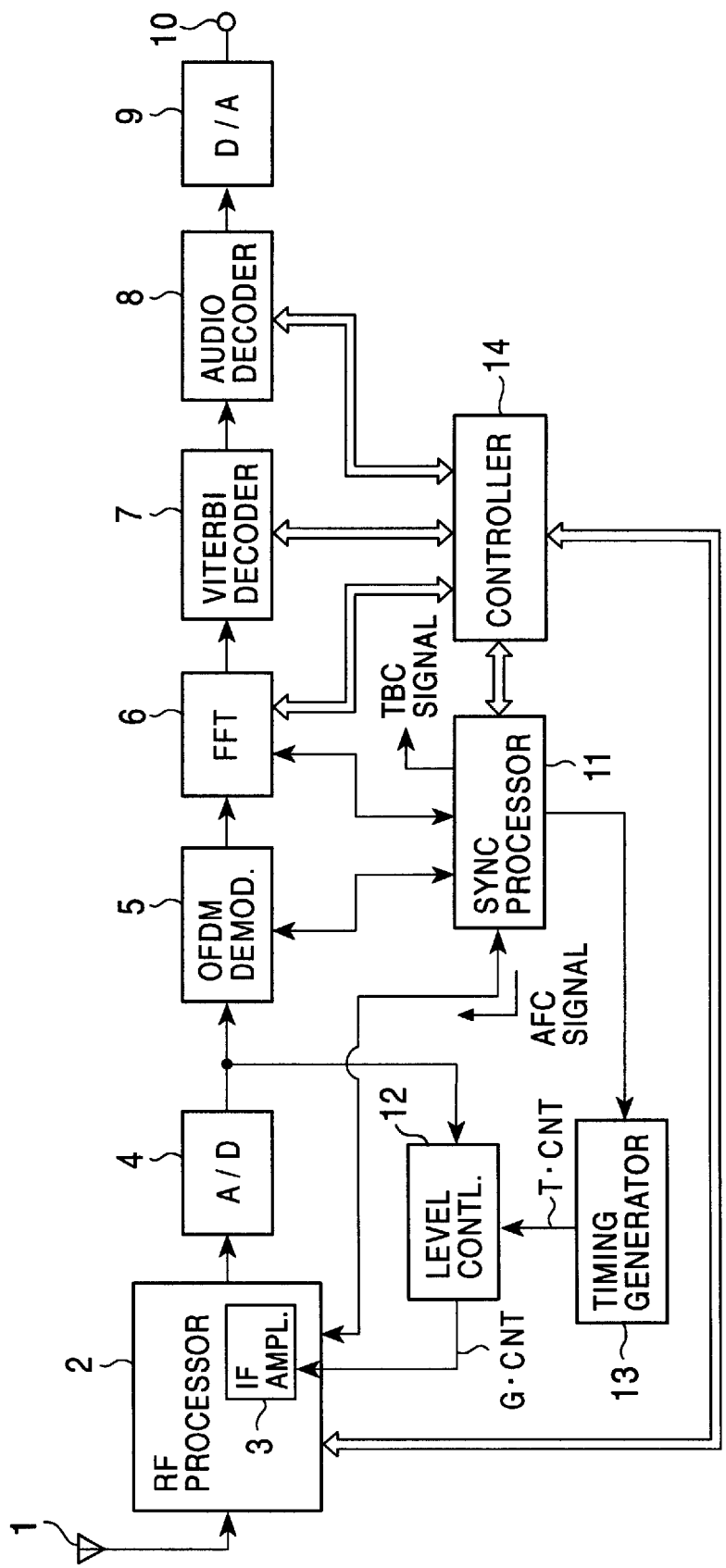
FIG. 1 is a block diagram showing one example of a DAB receiver for carrying out the invention.

A controller 14 executes various controls in the DAB receiver in FIG. 1. Namely, in addition to tuning operation, the controller 14 are coupled to the sync controller 11, the FFT circuit 6, the Viterbi decoder 7 and the audio decoder 8 by way of data bus (not shown) and mutually communicates with these circuit blocks for the controls.

Figure 2:
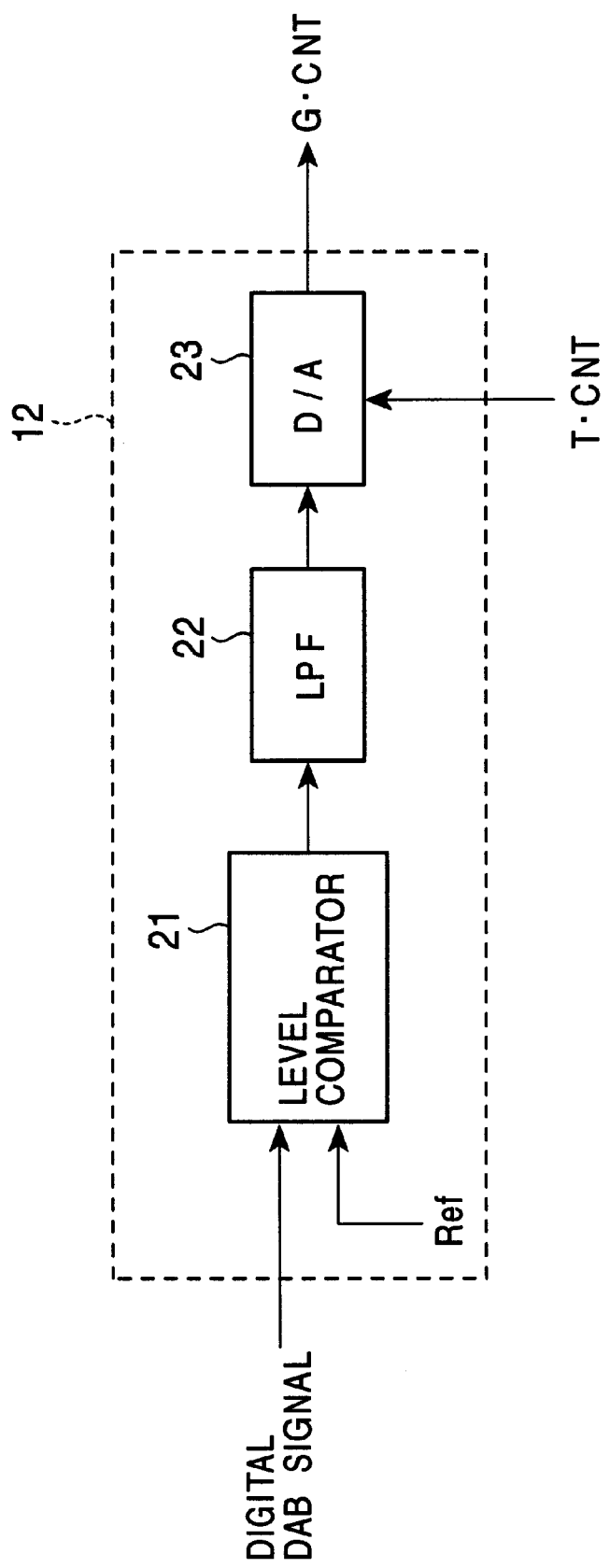
FIG. 2 is a block diagram showing one example of a level controller in FIG. 1.

FIG. 2 shows a detailed construction of the level controller 12, wherein the level controller 12 includes a level comparator 21, a low pass filter 22 and a D/A converter 23. In the level comparator 21, a signal level of the digital DAB signal from the A/D converter 4 is compared with a reference voltage Ref, and a digital error data obtained from the level comparator 21 is supplied to the low pass filter 22. The low pass filter 22 derives low frequency components of the digital error data and supplies this low frequency components to the D/A converter 23. The D/A converter 23 generates the gain control signal G·CNT by converting the digital error data from the low pass filter 22 into an analog voltage signal.

3) An AGC Processing.

Figure 3:
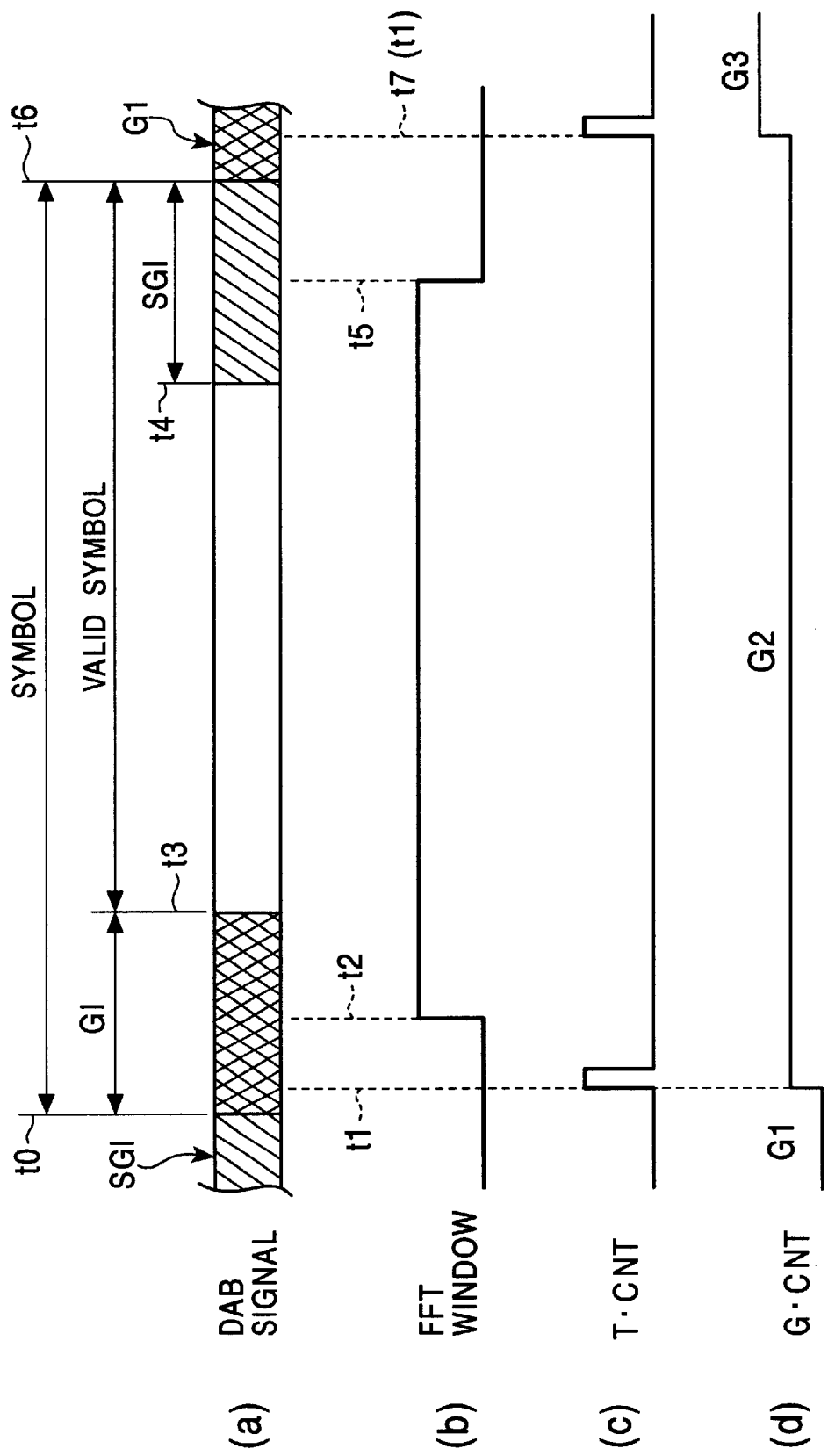
FIGS. 3A to 3D are timing charts showing operation of the AGC processing of the present invention.

Operation of an AGC processing for the DAB signal is explained with reference to a timing chart in FIG. 3A to FIG. 3D. The received DAB signal is depicted in FIG. 3A, where each symbol of the DAB signal is within a interval between t0 and t6. As described before with reference to FIG. 1, the FFT processing is applied to the DAB signal, but practically the FFT processing is not applied to entire interval of the DAB signal but applied to a valid interval of the DAB signal.

Namely as shown in FIG. 3B, a FFT window corresponding to an interval between t2 and t5 is generated to each symbol, and practically the FFT processing is executed to the DAB signal during the interval where the FFT window is high. In this case, a start time t2 of the FFT processing is generated within the GI (Guard Interval) and an end time t5 of the FFT processing is generated within the SGI (Sub Guard Interval). Namely, if the FFT processing to the DAB signal starts from a certain point within the GI and ends at a certain point within the SGI, the FFT processing is surely done to a valid data corresponding to a time interval between t3 and t4 as shown in FIG. 3A. This FFT processing is done to the consecutively incoming symbols.

The gain change according to the AGC in the IF amplifier 3 is done as follows. Namely, the timing of the gain change is determined by the timing control signal T·CNT obtained from the timing generator 13 as described before. The timing generator 13 receives the FFT window from sync processor 11 and generates the timing control signal T·CNT during the time when the FFT window is low.

A timing as the timing control signal T·CNT is shown in FIG. 3C. As shown in this FIG. 3C, the pulse of the timing control signal T·CNT is generated at a point t1 at first during the GI of one symbol. This point t1 is set within the GI and before the FFT window goes high. And following this, the pulse of the timing control signal T·CNT is generated at a point t7 (t1). This point t7 (t1) is set within the GI of the next symbol after the FFT window goes low. Thus the pulses of the timing control signal T·CNT are generated to all symbols in this embodiment.

Accordingly, the gain control signal G·CNT obtained from the D/A converter 23 of the level controller 12 becomes a pulse as shown in FIG. 3D.

In this FIG. 3D, the gain control signal G·CNT for setting a gain G1 is supplied to the IF signal amplifier 3 before the point t1, and at the point t1 the gain control signal G·CNT for setting a gain G1 is changed to a gain G2. The gain control signal G·CNT for setting the gain G2 is held until a point t7 (t1) where the next is timing control signal T·CNT is generated. At this point t7 (t1), the gain control signal G·CNT is changed from the gain G2 to G3.

According to this embodiment of the present invention, the timings of the gain change are determined within the interval where the FFT processing is not in operation. As clear from the above described explanation, signal distortion tends to occur at data position corresponding to the timings (t1 and t7 in FIG. 3A) of the gain change, but according to the present invention, there is no valid data at the interval between t1 and t7. Namely the timings for the gain change at the IF signal amplifier 3 are selected where the FFT processing is not actually done to the DAB signal such as the interval of one symbol except an interval between t3 and t4 in FIG. 3A.

The above described embodiment of the present invention is explained with regard to the DAB signal modulated based on the OFDM modulation system, but this invention can be applied to a signal receiving apparatus which receives signal including invalid data intervals (such as GI or SGI) between valid data.

While I have described and shown the particular embodiments of our invention, it will be understood that many modifications may be made without departing from the spirit thereof, and I contemplate by the appended claims to cover any modifications as fall within the true spirit and scope of my invention.

For example, the gain change may be executed during each SGI. In another case, such gain control can be done at every other GI or SGI intervals.

The key point of this invention is to avoid the gain change at the interval which includes valid data to be processed later.

What is claimed is:

1. An information receiving apparatus that receives an information signal having a valid time interval containing valid data and an invalid time interval containing invalid data, the apparatus comprising:

amplification means for amplifying a received information signal;

processing means connected to said amplification means for processing an output signal of said amplification;

gain control means coupled to said amplification means for controlling a gain of said amplification means; and timing control means coupled to said gain control means for controlling a timing of a gain setting of said gain control means at an interval where said processing means does not perform processing for said valid data in said output signal of said amplification means, wherein said gain control means comprises comparing means coupled to said amplification means for comparing a signal level of said output signal of said amplification means and a predetermined reference level to generate an error signal; and filtering means coupled to said comparing means for deriving low frequency components of said error signal, wherein the low frequency components of said error signal are supplied as a gain control signal to said amplification means.

2. The information receiving apparatus as claimed in claim 1, wherein said timing control means executes the gain setting of said gain control means within said invalid time interval of said received information signal.

3. The information receiving apparatus as claimed in claim 1, wherein said gain control means holds the gain of said amplification means during said valid time interval of said received information signal.

4. A broadcast signal receiving apparatus that receives a broadcast signal having a valid time interval containing valid data and an invalid time interval containing invalid data, the apparatus comprising:

amplification means for amplifying a received broadcast signal;

processing means connected to said amplification means for processing an output signal of said amplification means;

gain control means coupled to said amplification means for controlling a gain of said amplification means; and timing control means coupled to said gain control means for controlling a timing of a gain setting of said gain control means at an interval where said processing means does not perform processing for said valid data in said output signal of said amplification means, wherein said gain control means comprises comparing means coupled to said amplification means for comparing a signal level of said output signal of said amplification means and a predetermined reference level to generate an error signal; and filtering means coupled to said comparing means for deriving low frequency components of said error signal, wherein said low frequency components of said error signal are supplied as a gain control signal to said amplification means.

5. The broadcast signal receiving apparatus that receives information data as claimed in claim 4, wherein said timing control means executes the gain setting of said gain control means within said invalid time interval included in said received broadcast signal.

6. The broadcast signal receiving apparatus that receives information data as claimed in claim 4, wherein said gain control means holds the gain of said amplification means during said valid time interval of said received broadcast signal.

7. The broadcast signal receiving apparatus as claimed in claim 4, wherein the broadcast signal includes a plurality of carriers being orthogonally related to each other, and said processing means performs Fast Fourier Tansform processing.

8. A method for controlling a gain of an information receiving apparatus that receives an information signal having a valid time interval containing valid data and an invalid time interval containing invalid data, the method comprising the steps of:

amplifying a received information signal;

processing an output signal of said amplifying step;

comparing a signal level of the output signal with a predetermined reference level to generate an error signal;

deriving low frequency components of the error signal;

controlling a gain of said amplifying step in accordance with the low frequency components; and controlling a timing of a gain setting of said controlling a gain step at an interval where said processing step does not perform processing for said valid data in said output signal of said amplifying step.

9. The method for controlling a gain of an information receiving apparatus as claimed in claim 8, wherein said step of controlling a timing executes the gain setting in said step of controlling a gain within said invalid time interval.

10. The method for controlling a gain of an information receiving apparatus as claimed in claim 8, wherein said of controlling a gain holds the gain of said amplifying step during said valid time interval of said received information signal.

11. The method for controlling a gain of an information receiving apparatus as claimed in claim 8, amplifying step wherein said step of controlling a gain holds the gain of said amplifying step during successive gain settings.

* * * * *